US007620875B1

(12) United States Patent
Nelson et al.

(10) Patent No.: US 7,620,875 B1
(45) Date of Patent: Nov. 17, 2009

(54) ERROR CORRECTION CODE MEMORY SYSTEM WITH A SMALL FOOTPRINT AND BYTE WRITE OPERATION

(75) Inventors: Michael D. Nelson, Mountain View, CA (US); Hamish T. Fallside, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 681 days.

(21) Appl. No.: 11/369,337

(22) Filed: Mar. 7, 2006

(51) Int. Cl.
*G11C 29/00* (2006.01)
(52) U.S. Cl. ..................................... 714/763
(58) Field of Classification Search ................. 714/763, 714/723
See application file for complete search history.

(56) References Cited

U.S. PATENT DOCUMENTS 5,961,660 A * 10/1999 Capps et al. ................ 714/763
7,117,421 B1 * 10/2006 Danilak ...................... 714/763
7,152,138 B2 * 12/2006 Spencer et al. .............. 711/103
7,242,615 B2 * 7/2007 Nagashima ............ 365/185.09
7,464,241 B2 * 12/2008 Vogt ........................... 711/168
7,487,428 B2 * 2/2009 Co et al. ..................... 714/763

\* cited by examiner

*Primary Examiner*—Esaw T Abraham
(74) *Attorney, Agent, or Firm*—LeRoy D. Maunu (57) ABSTRACT

A method, apparatus and program storage device that provides an error correction code memory system with a small footprint and byte write operation. A memory controller virtualizes the memory controller interface, multiplexes ECC data onto the same pins as data, and stores replicated ECC data structures interleaved with data in system memory. These mechanisms enable a range of very cost effective small memory subsystems that support ECC operation in a minimum of standard commodity memory devices. ECC encoding is provided to support efficient byte write operations.

20 Claims, 12 Drawing Sheets

ERROR CORRECTION CODE MEMORY SYSTEM WITH A SMALL FOOTPRINT AND BYTE WRITE OPERATION

FIELD OF THE INVENTION

This invention relates in general to memory systems for electronic devices, and more particularly to a method, apparatus and program storage device that provides an error correction code memory system with a small footprint and byte write operations.

BACKGROUND

Memory integrity is a critical factor for a wide variety of integrated circuits. Memory errors, which affect memory integrity, are a significant concern in system applications because they may affect a process operation. For example, control or operating programs and input/output (I/O) decisions are typically stored in RAM and precisely direct physical operations of the system. If an input bit were to suddenly change due to a memory error, the control program may react to the changed input by erroneously turning on or off a key output. Depending on the nature of the output change, undesirable consequences may occur. Likewise, if a control program bit were to change unpredictably, the device may execute a random and/or unpredictable sequence—this again may lead to undesirable results. In devices such as programmable logic devices (PLDs), corruption of a bit in the memory that configures the configurable logic resources is also a critical concern. Thus, for robust systems design, memory error detecting systems are generally necessary to ensure memory integrity.

The classical approach to detection and correction of errors is by use of an error correction code (ECC). An error correction code associated with a slice of data is stored. If an error is detected when memory is read, correction algorithms may be applied to the faulty data in conjunction with stored ECC codes, and in some cases, data may be restored. One such class of ECC correcting algorithms include utilization of "Hamming Codes" which are employed to detect and correct errors that may have occurred.

The application of error detection and correction schemes present cost challenges to systems designers as conventional ECC memory subsystems require additional memory devices, which increase component costs and board area. An additional drawback to conventional schemes is the inefficiency of byte write operations. This is due to the need to read all data supported by the encoding, updating this structure with the modified byte, updating the ECC code, and then writing this entire structure back to memory (i.e. Read/Modify/Write).

It can be seen then that there is a need for a method, apparatus and program storage technique that provides an error correction code memory system with a small footprint and efficient byte write operations.

SUMMARY

To overcome the limitations in the prior art described above, and to overcome other limitations that will become apparent upon reading and understanding the present specification, the present invention discloses a method, apparatus and program storage device that provides an error correction code memory system with a small footprint and byte write operations.

Embodiments of the present invention solve the above-described problems by providing a memory controller scheme that may virtualize the memory controller interface, multiplex ECC data onto the same pins as data, and store replicated ECC data structures interleaved with data in system memory. These mechanisms enable a range of very cost effective small memory subsystems that support ECC operation in a minimum of standard commodity memory devices. In addition, an ECC encoding method is provided to support efficient byte write operations.

A method in accordance with an embodiment of the invention includes receiving data for processing, processing error correction codes associated with at least a portion of the data, and mapping the data and the error correction codes for a small footprint memory.

In various other embodiments of the invention, a memory control system is provided. The memory control system includes a memory interface for coupling to user logic, a small-footprint memory device having a plurality of data pins, and a memory controller that is coupled to the memory interface and the small-footprint memory device. The memory controller multiplexes an error correction code and data across at least one of the data pins of the small-footprint memory device.

In another embodiment of the invention, a program storage device having program instructions executable by a processing device to perform operations for providing an error correction code memory system is provided. The operations include receiving data for processing, processing error correction codes associated with at least a portion of the data, and mapping the data and the error correction codes for a small footprint memory. The error correction codes and the portion of the data are multiplexed across at least one pin of the small footprint memory.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The conflicting requirements of minimizing system cost, power consumption, and printed circuit board area challenge designers of systems that provide correction of memory errors. With logic in the memory controller, however, an error correction code memory system may be made in a single commodity memory device with adequate capacity and performance for many embedded processing applications.

Figure 1:
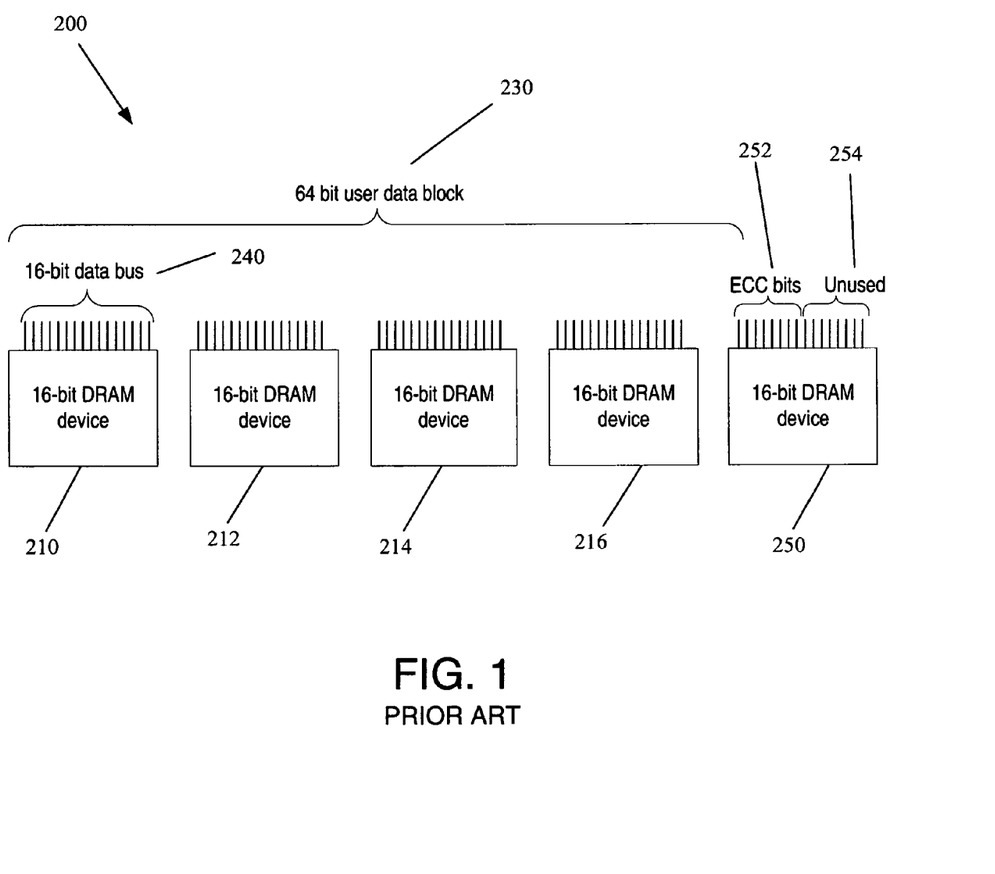
FIG. 1 illustrates a conventional ECC implementation.

The present invention provides a method, apparatus and program storage device that provides an error correction code memory system with a small footprint and byte write operation. A memory controller virtualizes the memory controller interface, multiplexes ECC data onto the same pins as data, and stores replicated ECC data structures interleaved with data in system memory. These mechanisms enable a range of very cost effective small memory subsystems that support ECC operation in a minimum of standard commodity memory devices. ECC encoding is provided to support efficient byte write operations FIG. 1 illustrates a conventional ECC implementation 200. In FIG. 1, a plurality of memory devices, such as dynamic random access memories (DRAMs) 210-216 provide a 64-bit user data block 230, wherein each memory device includes a 16-bit data bus 240. A separate memory device 250 is used to provide ECC bits 252. As can be seen, conventional memory systems use an additional device (sometimes only partially utilized, i.e., unused 254) for ECC bits. This arrangement works well, but requires more memory chips, I/O pins, power, and PCB board area to implement the memory subsystem.

Figure 2:
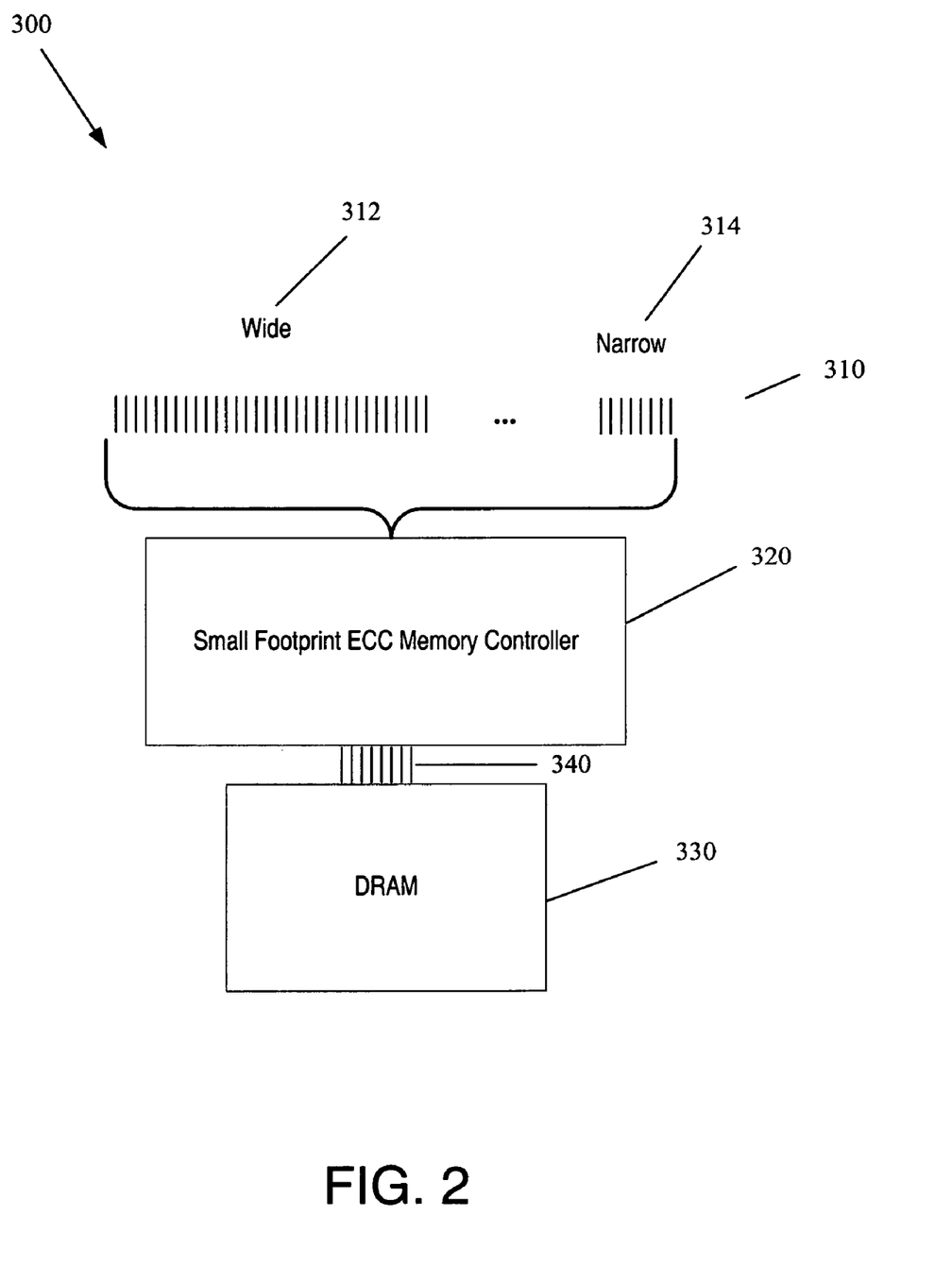
FIG. 2 illustrates a block diagram providing an overview of the ECC memory system according to an embodiment of the present invention.

FIG. 2 illustrates a block diagram providing an overview of the ECC memory system 300 according to an embodiment of the present invention. In FIG. 2, a memory interface 310 is presented to user logic. The memory interface 310 may be implemented with any desired width, e.g., wide (312) to narrow (314). For example, the width of the memory interface 310 may be implemented using a standard 32 or 64 bits. The size is selected for the convenience of the application. An ECC memory controller 320 is coupled to the memory interface 310. The ECC memory controller 320 facilitates the use of a small footprint memory (e.g., DRAM or RAM or non-volatile memory), for example, DRAM 330 and virtualizes the controller interface to enable mapping memory controllers of various widths for internal logic to various small footprint configurations of standard commodity memory devices 330. The virtualization of the controller interface insulates the user application from this complexity. The memory controller 320 is coupled to a commodity dynamic random address memory (DRAM) device 330 via, for example, an 8-bit to 16-bit wide path 340. Thus, an ECC memory system 300 may be provided with minimal cost while using the smallest board area.

Figure 3:
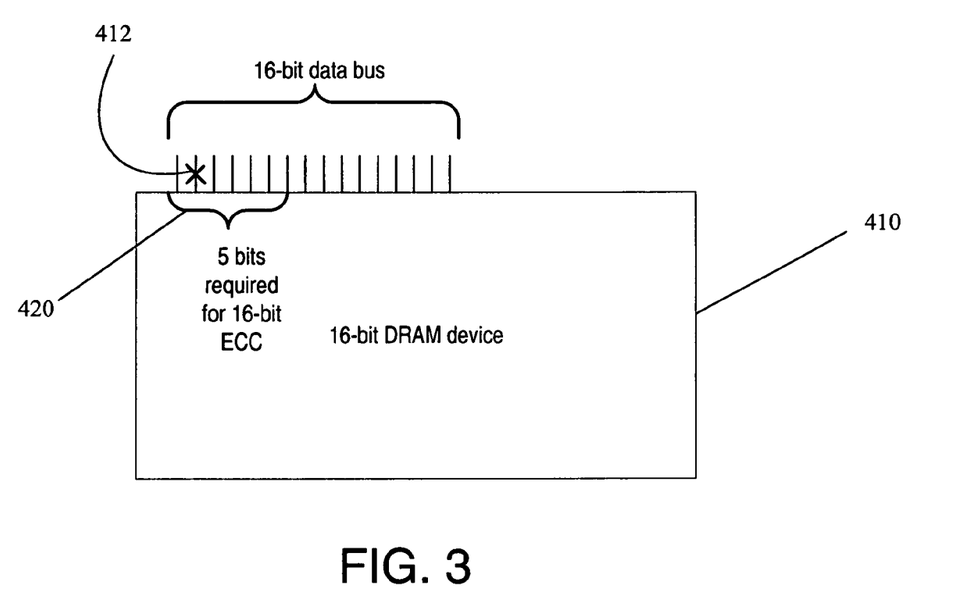
FIG. 3 illustrates a 16 bit DRAM device with corruption or failure of a single ECC pin according to an embodiment of the present invention.

In another embodiment of the present invention, data and error correction codes are multiplexed across the same pins to facilitate the use of standard memory devices. This enables system configurations in as little as a single standard commodity memory device. However, when data and ECC are multiplexed across the same pins, a pin failure in the ECC field must be accounted for. FIG. 3 illustrates a 16-bit DRAM device 410 with corruption or failure of a single ECC pin 412 according to an embodiment of the present invention. For example, for 16 bits of data, five bits of ECC are required. However, if a pin 412 fails in the ECC as shown in FIG. 3, both data and the ECC bits will be corrupted, and an error could occur that would go undetected.

Figure 4:
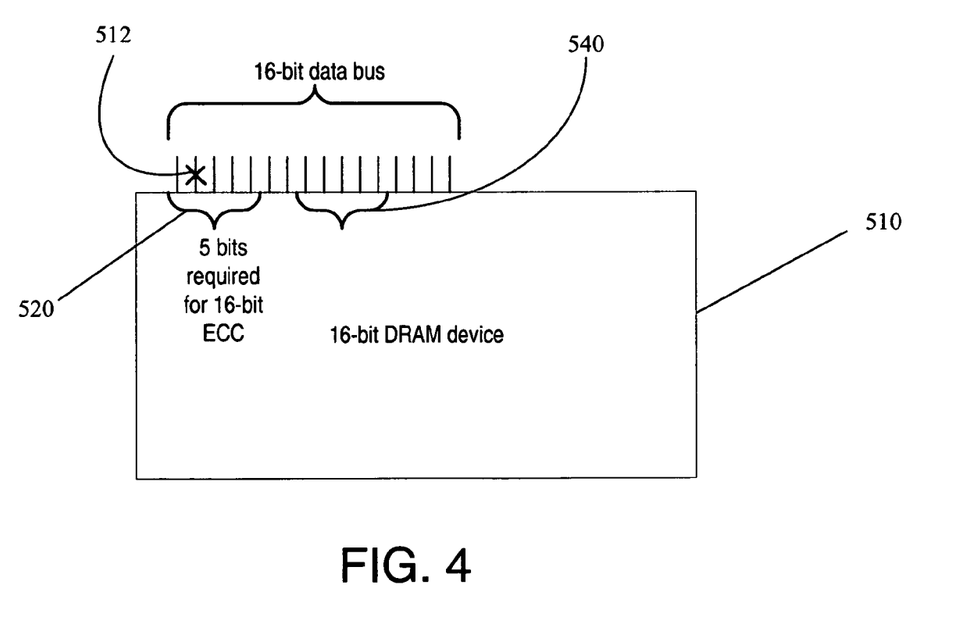
FIG. 4 illustrates one method for preventing corruption of data and ECC upon a single ECC pin failure according to an embodiment of the present invention.

FIG. 4 illustrates one method for preventing corruption of data and ECC upon a single ECC pin failure according to an embodiment of the present invention. In FIG. 4, additional overhead is incurred by including replicated ECC bits 540 at least once across a different set of pins. However, the replicated ECC bits enable the system to detect and correct a pin failure, such as a failure of pin 512.

In another embodiment of the present invention, single byte write operations are capable of being performed without an unnecessary performance penalty. This involves interleaving replicated ECC codes along with data across system memory on a per-byte basis. For example, a single byte write involves writing less than the full width of a memory interface between the application to the controller. Thus, writing 1 byte in a conventional design having ECC calculated for a block of data as wide as the memory interface or a multiple thereof can introduce undesirable overhead. In this conventional case, the entire hybrid data/ECC structure is read from the address where the sub element (the single byte) resides. The ECC for this block is recalculated with the modified data element. Then this entire update is written back into memory. This is also referred to as a read/modify/write operation. Note a DRAM is used for illustration purposes, and some embodiments of the invention also cover static RAM.

In contrast, various embodiments of the invention have ECC calculated for each byte of data. A single byte write may still involve writing less than the full width of the memory interface between the application and the controller. However, a read/modify/write operation is not needed because ECC can be calculated for the single byte without requiring additional data for a block of data to be first read from the memory. Thus, after calculating the ECC for the single byte, only a write operation is required to update the memory with the single byte write. Calculating ECC over each byte and replicating the ECC permits a small footprint memory having as few as a single DRAM with an interface that is 8 bits wide or wider. It will be appreciated that ECC may be calculated for a data unit having a width other than a byte. For example, calculating ECC over each 4-bits of data would allow support of single byte writes and a small footprint memory having as few as a single DRAM having a 4-bit or wider interface.

Figure 5:
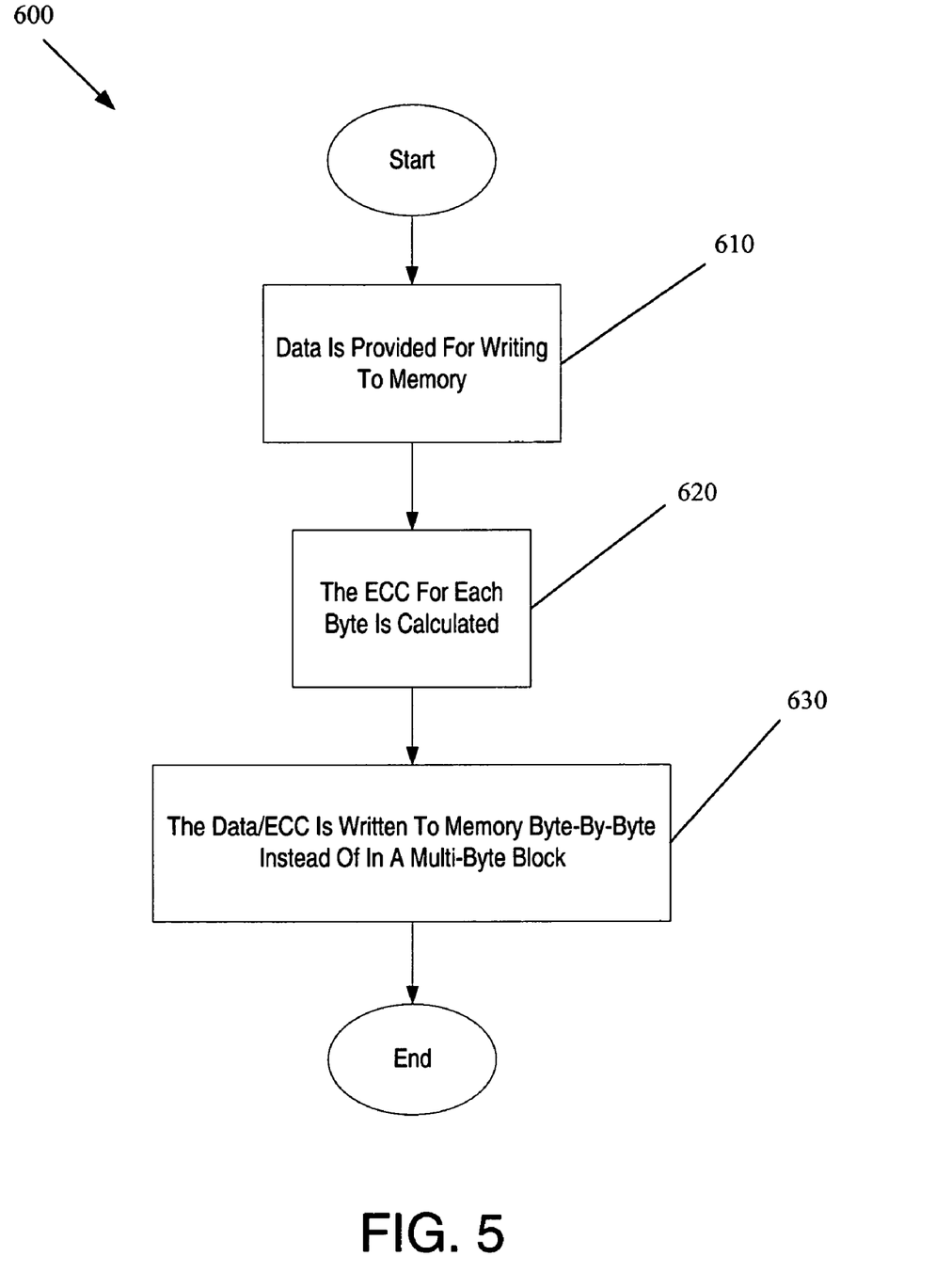
FIG. 5 is a flow chart for performing efficient single byte write operations according to an embodiment of the present invention.

FIG. 5 is a flow chart 600 for performing efficient single byte write operations according to an embodiment of the present invention. Data to be written to memory is provided 610. The ECC for each byte of the write data is calculated 620. The data/ECC is written to memory byte-by-byte instead of in a single block of multiple bytes 630. Thus, by careful crafting the interleaved data/ECC bit structure, including limiting the amount of ECC bits and replicated ECC bits required and distributing the ECC bits and replicated ECC bits across distinct DRAM pins, efficient single byte write operations are possible without the conventional performance penalty of a read/modify/write operation. Therefore, the interleaving of data and ECC byte-by-byte enables single byte writes to be performed at least as fast as any other ECC protected write operation.

Figure 6:
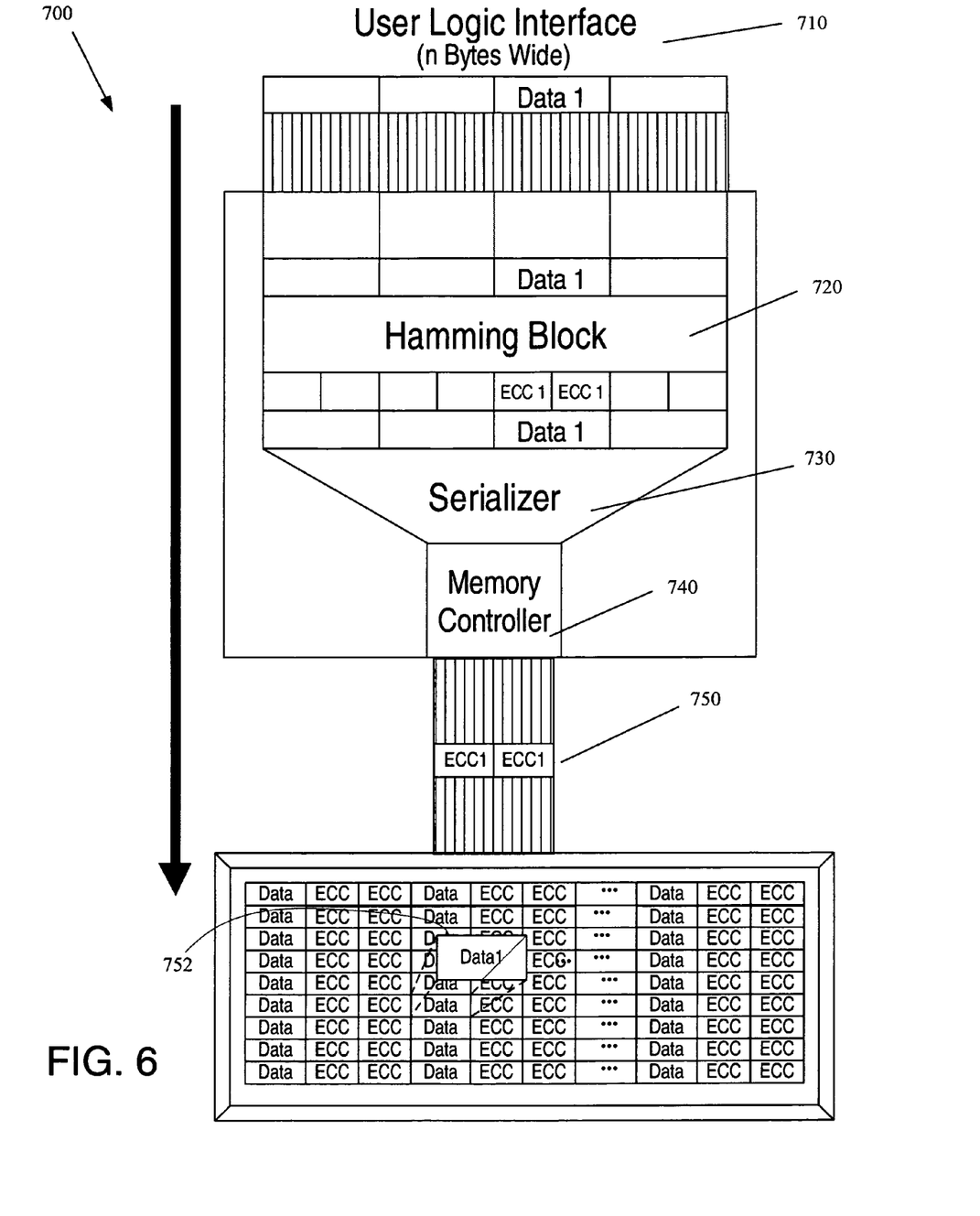
FIG. 6 is a diagram of a single byte write operation according to an embodiment of the present invention.

FIG. 6 is a diagram of a single byte write operation 700 according to an embodiment of the present invention. In FIG. 6, write data is provided to the n-byte wide user logic interface 710. The Hamming block 720 calculates a Hamming code for the single byte of data being written. The ECC and data are serialized 730 and provided to the memory controller 740. The ECC 750 for each byte of data 752 is calculated and stored separately from the byte of data 752. The data 752/ECC 750 is written to memory byte-by-byte instead of in a single block of multiple bytes. In one embodiment, the Hamming code ECC 750 for a byte of data requires 4-bits, which is duplicated to form an 8-bit ECC. Thus, writing a single byte of write data may require two byte-by-byte writes. Depending upon the width of the interface of the small footprint memory, these two bytes byte-by-byte writes may require writing each byte serially or both bytes in parallel.

Figure 7:
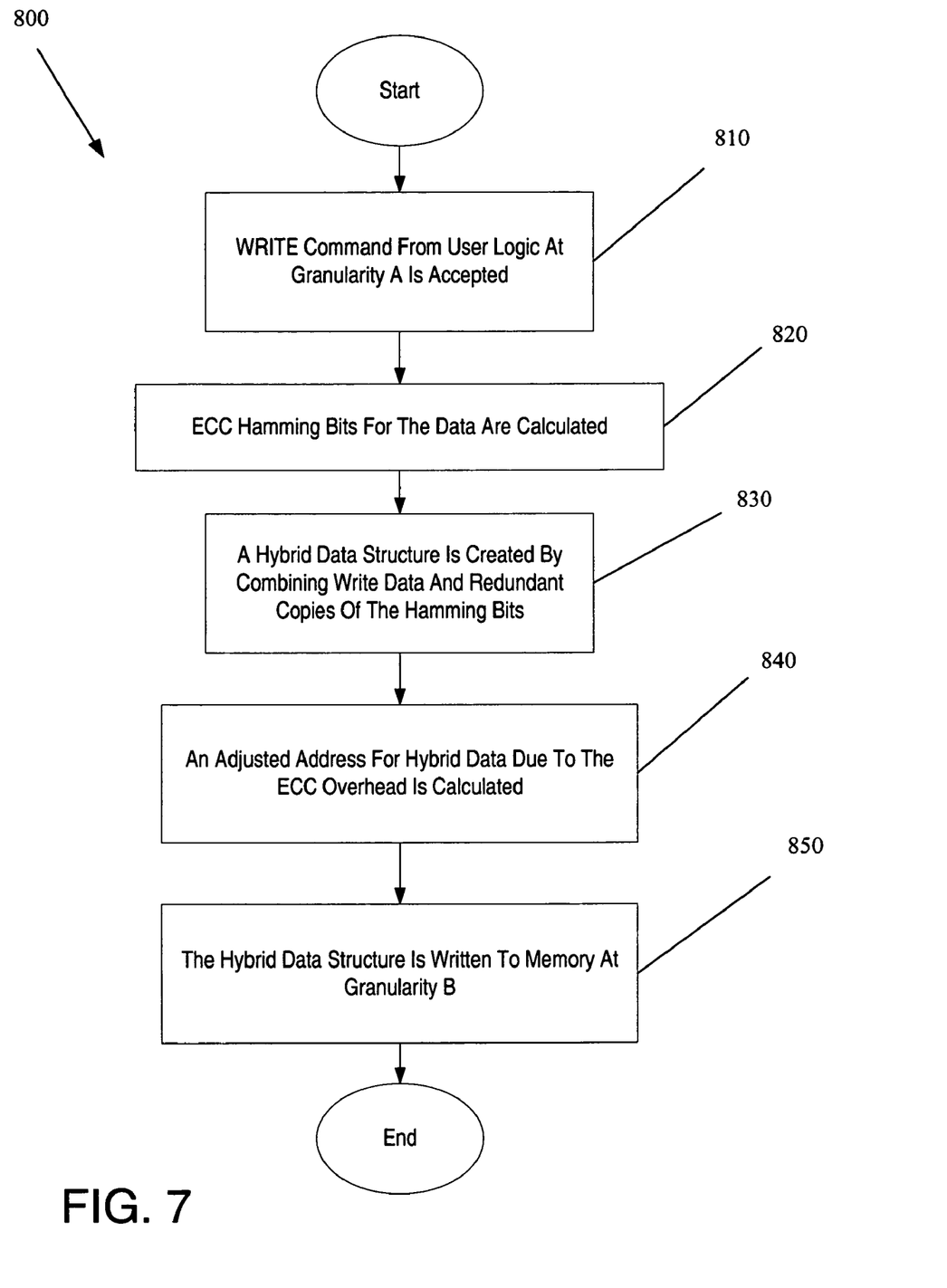
FIG. 7 is a flow chart of the write process according to an embodiment of the present invention.

FIG. 7 is a flow chart 800 of the write process according to an embodiment of the present invention. A WRITE command from user logic at granularity A is accepted 810. Granularity A refers to the number of bytes supplied in the write command, which may be a multiple of the width in bytes of the memory interface between the application and the controller. The write command may include byte write enables that indicate less than all the data supplied in the WRITE command should be written to memory. For example, a single byte write may supply a block of data having 8 bytes and one asserted byte write enable that indicates a particular one of the supplied bytes should be written to memory. ECC Hamming bits for each byte of the data are calculated 820. A hybrid data structure is created by combining write data and redundant copies of the Hamming bits 830. An adjusted address for hybrid data due to the ECC overhead is calculated 840. The hybrid data structure is written to memory at granularity B 850. Granularity B refers to the width of the interface to the small footprint memory.

Figure 8:
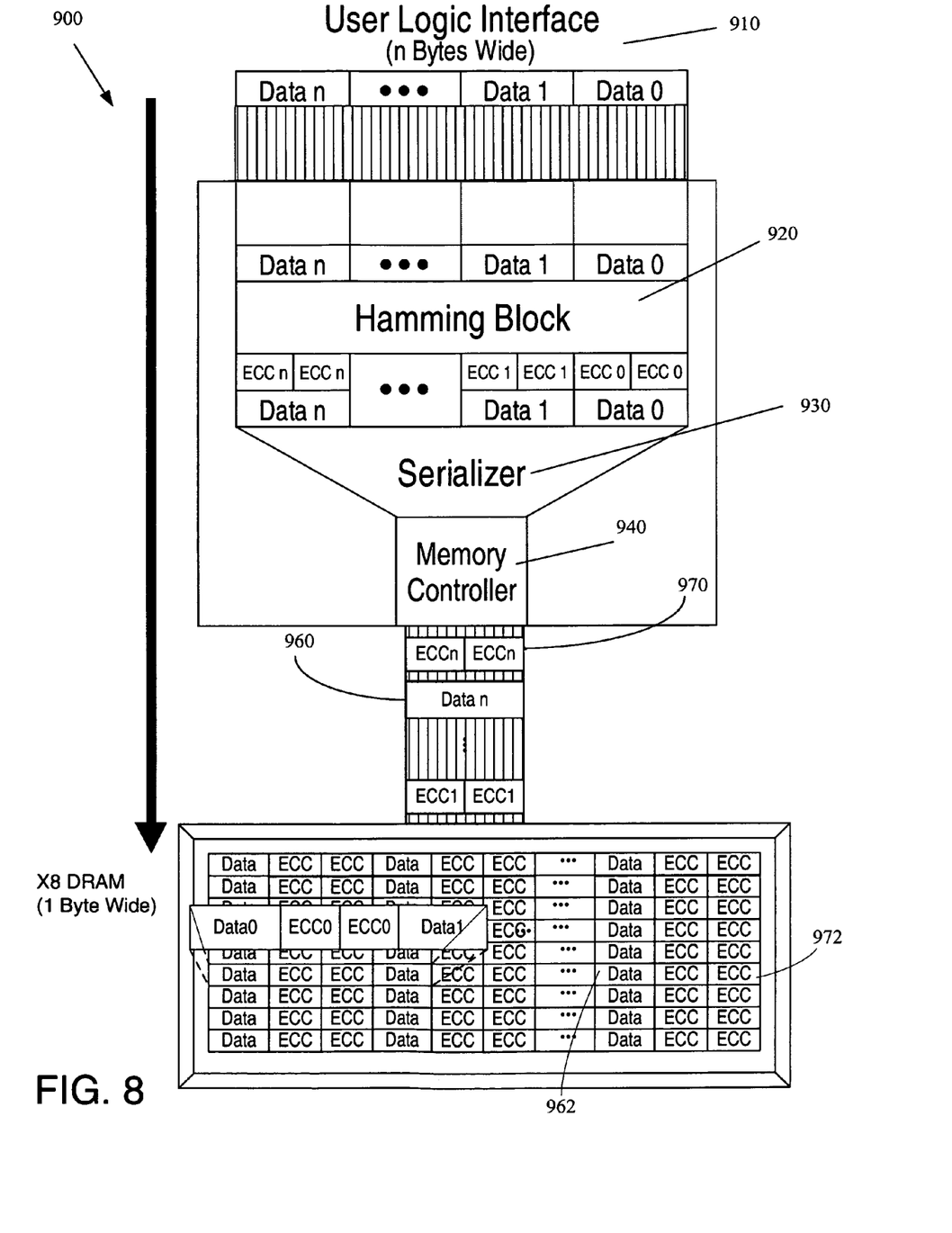
FIG. 8 is a write block diagram according to an embodiment of the present invention.

FIG. 8 is a write block diagram 900 according to an embodiment of the present invention. In FIG. 8, write data is provided to the n bytes wide user logic interface 910. The Hamming block 920 calculates Hamming codes for each byte of write data. The ECC and data are serialized 930 and provided to the memory controller 940. As shown in FIG. 8, Data n 960 is written to memory at an address 962 as shown. The corresponding ECC n 970 is written to an ECC address 972 proximate to address 962.

Figure 9:
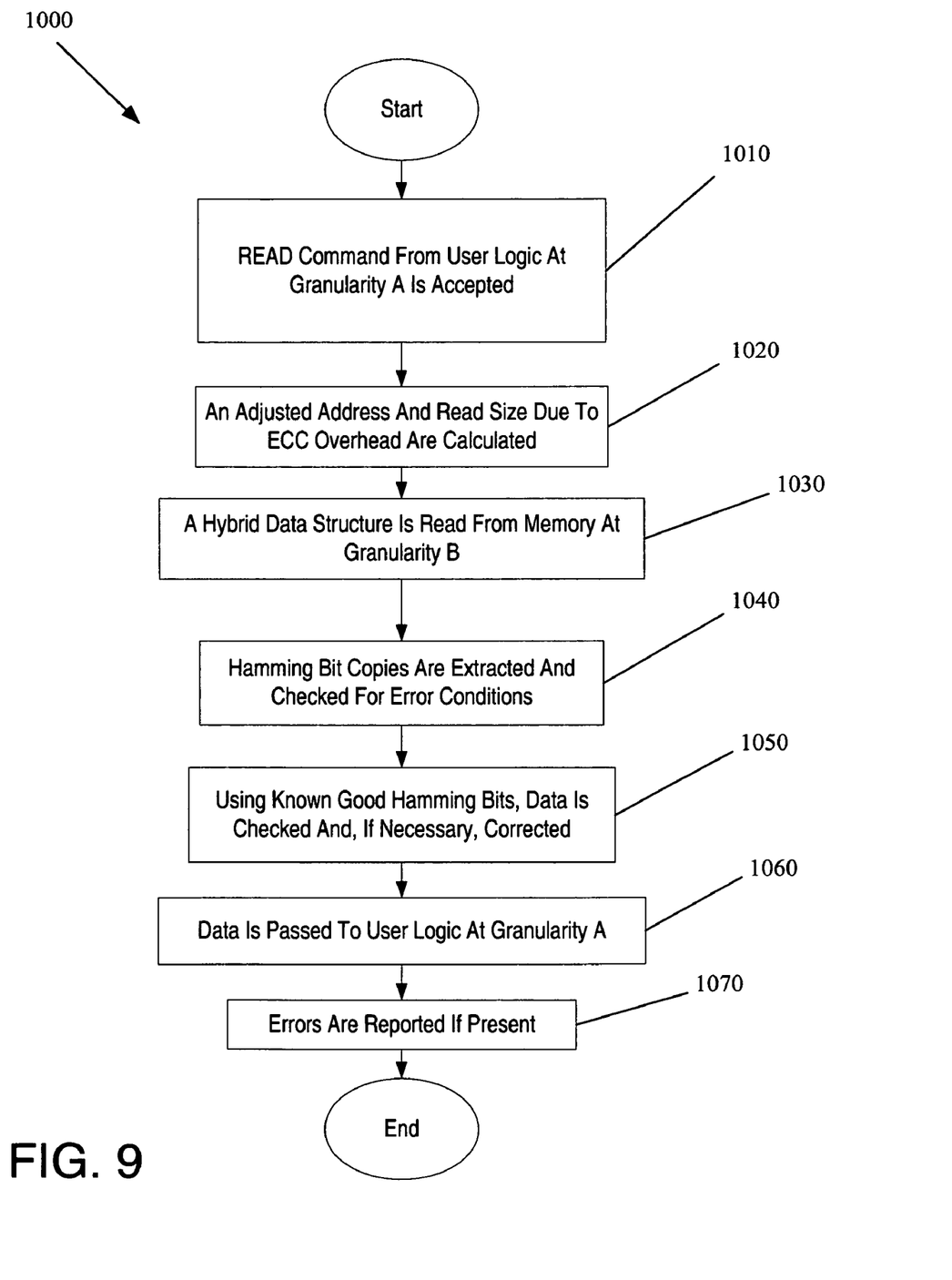
FIG. 9 is a flow chart of the read process according to an embodiment of the present invention.

FIG. 9 is a flow chart 1000 of the read process according to an embodiment of the present invention. A READ command from user logic at granularity A is accepted 1010. An adjusted address and read size due to ECC overhead are calculated 1020. A hybrid data structure is read from memory at granularity B 1030. Hamming bit copies are extracted and checked for error conditions 1040. Checking the Hamming bits may include verifying that the ECC and duplicated ECC are identical. Using known good Hamming bits, data is checked and, if necessary, corrected 1050. Data is passed to user logic at granularity A 1060. Errors are reported if present 1070.

Figure 10:
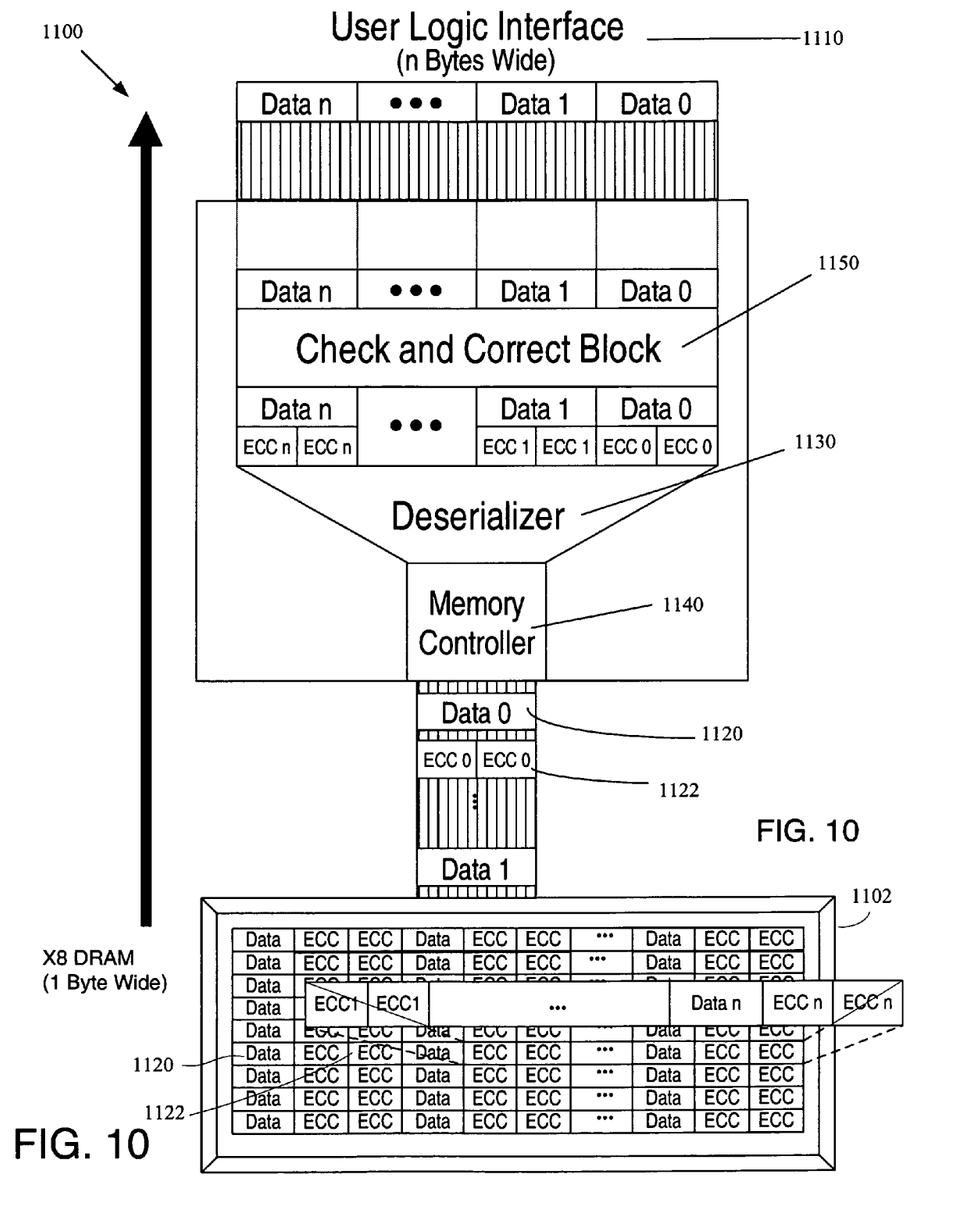
FIG. 10 is a read block diagram according to an embodiment of the present invention.

FIG. 10 is a read block diagram 1100 according to an embodiment of the present invention. In a read operation as shown in FIG. 10, data is read from the DRAM 1102. Data 0 1120 is provided from the DRAM 1102 to the memory controller 1140. The corresponding ECC 0 1122 is then read from the DRAM 1102. The data 1120 and ECC 1122 are then deserialized 1130. A check and correct block 1150 compares the ECC to the data. If the data 1120 is correct, the data 1120 is provided to the user logic interface 1110 in granularity A. If the data 1120 is not correct, corrections are performed if possible and the corrected data is provided to the user logic interface 1110.

Figure 11:
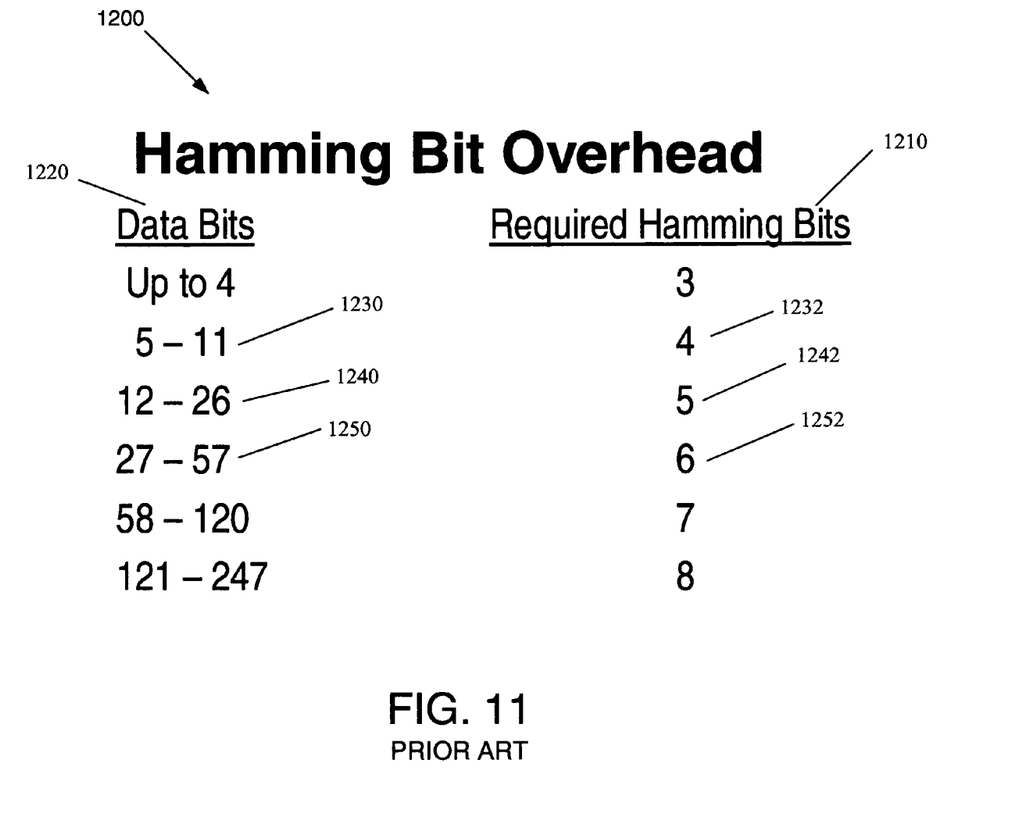
FIG. 11 is a chart showing the Hamming bit overhead relative to the number of data bits according to the prior art.

FIG. 11 is a chart 1200 showing the Hamming bit overhead relative to the number of data bits. The Hamming bit overhead, i.e., the number of required Hamming bits 1210 relative to the data bits 1220, increases as a percentage of total bits as the number of data bits decreases. For example, to write 8 bit data blocks 1230 with ECC, 4 additional Hamming bits 1232 are required. However, for 16 bit data blocks 1240, only 5 Hamming bits 1242 are needed. Further, for 32 bit data blocks 1250, only 6 Hamming bits 1252 are needed.

Figure 12:
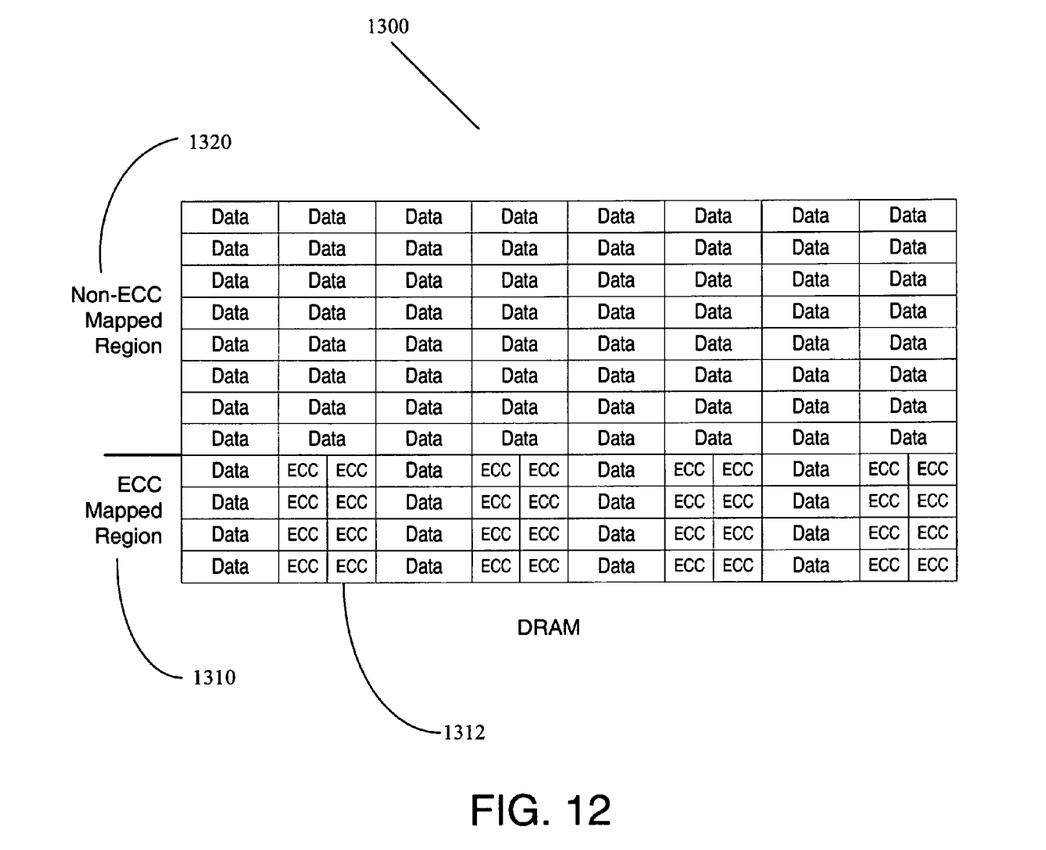
FIG. 12 is a diagram of mapped memory according to an embodiment of the present invention.

In another embodiment of the present invention, memory mapped ECC is used to allow ECC to be an option. Rather than having a dedicated device for ECC support, an embodiment of the present invention interleaves data and ECC together dependent upon the destination address. Memory mapping will determine whether or not data is ECC protected based upon where the data resides in the system. This allows a user to optimize memory capacity and performance if large memory using aspects of the application do not require ECC protection. FIG. 12 is a diagram of mapped memory 1300 according to an embodiment of the present invention. In FIG. 12, memory is partitioned so that a range of memory addresses in region 1310 use ECC 1312 while a second region 1320 does not use ECC. In this manner, certain types of data that cannot benefit from ECC, for example due to the delays inherent with ECC processes, may be stored in the region 1320 of memory that does not use ECC. Then, other data may be provided in the region 1310 that uses ECC to ensure that data integrity is maintained. For example, system code and essential data may be mapped to ECC-protected region 1310, but non-essential data, such as video frame buffer data, may be mapped to ECC-unprotected region 1320. In this example if an error occurred in the video region of memory the screen might display an artifact until refreshed, but the system integrity and stability would never be at risk.

The various embodiments of the invention provide an error correction code memory system with a small footprint and byte write operations. The memory system may be implemented on numerous different integrated circuits including memory controllers, application specific integrated circuits (ASICs), and programmable logic devices (PLDs). Whether the invention is implemented on one type of integrated circuit or another is application dependent. An example PLD on which the invention could be implemented is a field programmable gate array (FPGA). In the case of a PLD a SRAM replaces the DRAM described above. Even though a specific FPGA architecture is described below in FIG. 13, those skilled in the art will appreciate, however, that the invention could be implemented in different FPGA architectures, other types of programmable logic devices (PLDs) other than FPGAs, integrated circuits that include programmable logic circuitry and/or adapted to various application requirements, based on both volatile and non-volatile technologies, or even ASICs.

Figure 13:
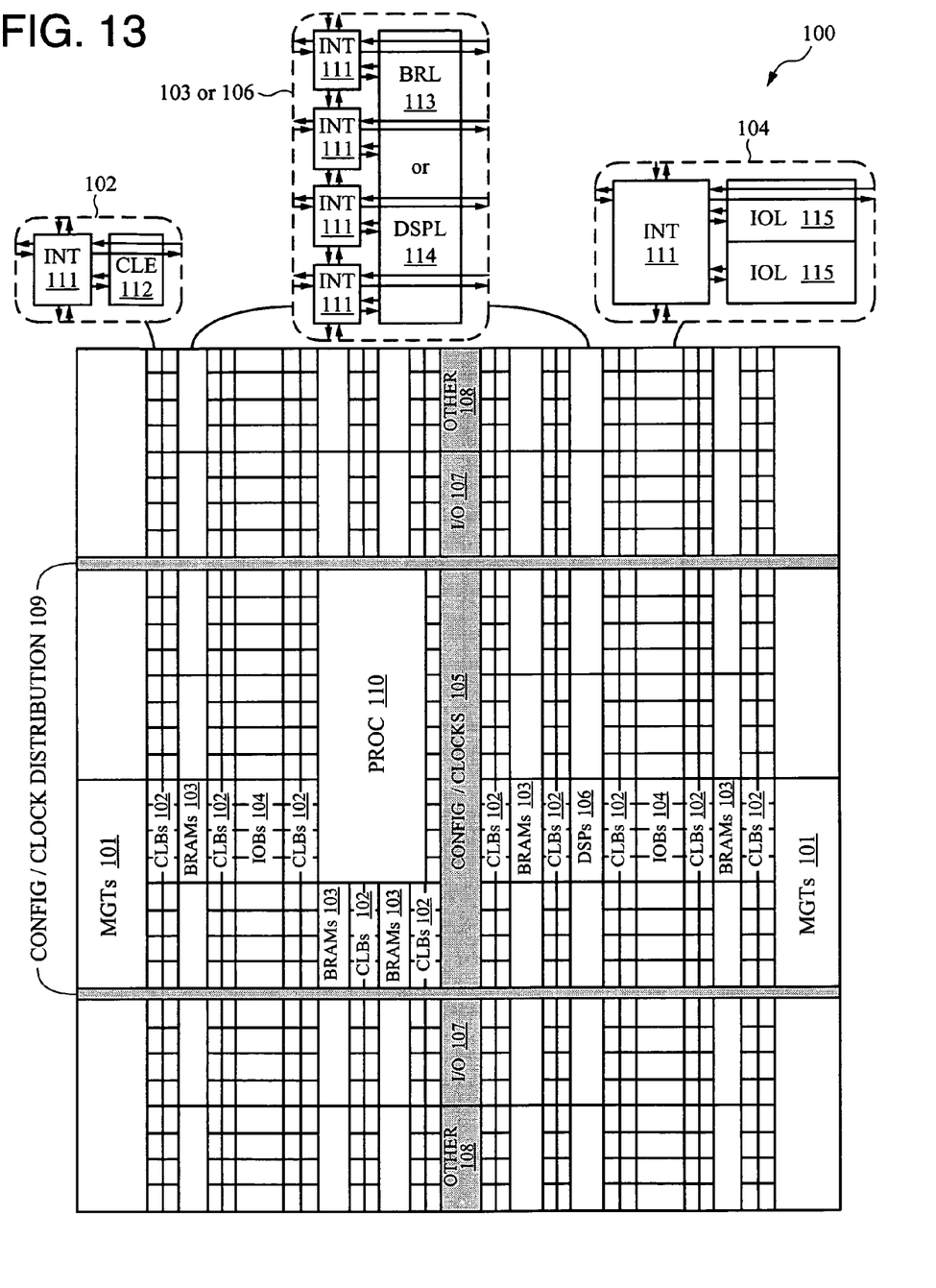
FIG. 13 is a schematic diagram of an embodiment of an FPGA on which various embodiments of the invention may be used.

Advanced FPGAs may include several different types of programmable logic blocks in the array. For example, FIG. 13 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 13.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 13) is used for configuration, clock, and other control logic. Horizontal areas 109 extending from this column are used to distribute the clocks and configuration signals across the breadth of the FPGA.

Some FPGAs utilizing the architecture illustrated in FIG. 13 include additional logic blocks that disrupt the regular columnar structure making up a large part of the FPGA. The additional logic blocks can be programmable blocks and/or dedicated logic. For example, the processor block PROC 110 shown in FIG. 13 spans several columns of CLBs and BRAMs.

Note that FIG. 13 is intended to illustrate only one example of an FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 13 are provided purely as one illustration of an FPGA architecture. For example, in an actual FPGA more than one adjacent column of CLBs is typically included wherever the CLBs appear, to facilitate the efficient implementation of user logic.

It will be appreciated that PLDs having different layouts of CLBs, IOBs, and interconnect circuitry (and the functional equivalents thereof) may also implement the various embodiments of the invention described herein.

The foregoing description of the embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for providing an error correction code memory system, comprising:
   receiving data for processing;
   processing error correction codes associated with at least a portion of the data;
   wherein the processing error correction codes associated with at least the portion of the data comprises generating a first set of error correction codes and replicating the first set of error correction codes at least once as a respective second set of error correction codes; and
   mapping the data and the error correction codes for a small footprint memory, wherein the error correction codes and the portion of the data are multiplexed across pins of the small footprint memory;
   wherein the mapping the data and the error correction codes comprises mapping the first and second sets of error correction codes across different ones of the pins.

2. The method of claim 1, wherein the mapping the data and the error correction codes comprises writing the data and the error correction codes to the small footprint memory byte-by-byte.

3. The method of claim 1, wherein the receiving the data for processing comprises accepting a write command from user logic at a first granularity, the processing error correction codes associated with at least the portion of the data comprises calculating the error correction codes for the portion of the data, and the mapping the data and the error correction codes comprises creating a hybrid data structure that includes the data and the error correction codes, and calculating an adjusted address for the hybrid data structure due to overhead of the error correction codes.

4. The method of claim 3, wherein the mapping the data and the error correction codes further comprises writing the data and the error correction codes to the small footprint memory at a second granularity.

5. The method of claim 3, wherein the creating the hybrid data structure comprises serializing the data and the error correction codes.

6. The method of claim 1, wherein the receiving the data for processing comprises accepting a read command from user logic at a first granularity, the processing error correction codes associated with at least the portion of the data comprises extracting the error correction codes and checking the portion of the data using the error correction codes, and the mapping the data and the error correction codes comprises calculating an adjusted address and read size due to overhead of the error correction codes and reading a hybrid data structure from the small footprint memory at a second granularity.

7. The method of claim 6, wherein the checking the portion of the data comprises reporting an error in response to the portion of the data being identified as corrupt.

8. The method of claim 1 wherein the small footprint memory is part of a programmable logic device.

9. The method of claim 1, wherein the mapping the data and the error correction codes comprises mapping the small footprint memory into at least a first and second portions, wherein the first portion comprises a non-error correction region and the second portion comprises an error correction region.

10. The method of claim 9, wherein the mapping the data and the error correction codes further comprises interleaving the data and the error correction codes together in response to a destination address for the data.

11. The method of claim 10, wherein the interleaving the data and the error correction codes together in response to the destination address for the data further comprises mapping ECC-protected data to the error correction region and mapping ECC-unprotected data to the non-error correction region.

12. The method of claim 1, wherein the processing includes calculating a respective error correction code for each byte of the data.

13. A memory control system, comprising:
a memory interface for coupling to user logic;
a small-footprint memory device having a plurality of data pins; and
a memory controller, coupled to the memory interface and the small-footprint memory device, the memory controller adapted to multiplex an error correction code and data across the data pins of the small-footprint memory device;
wherein the memory controller is further adapted to generate a first set of error correction codes from the data, replicate the first set of error correction codes at least once as a respective second set of error correction codes, and map the data and the first and second sets of error correction codes across different ones of the pins of the memory device.

14. The memory control system of claim 13, wherein the memory controller is adapted to correct the data during failure of any one of the data pins.

15. The memory control system of claim 13, wherein the memory controller is adapted to replicate the error correction code at least once across different ones of the data pins.

16. The memory control system of claim 13, wherein the memory controller is adapted to write the data and the error correction code to the small-footprint memory device byte-by-byte.

17. The memory control system of claim 13, wherein the memory controller is adapted to map the small-footprint memory into at least a first and second portions, wherein the first portion comprises a non-error correction region and the second portion comprises an error correction region.

18. The memory control system of claim 13, wherein the memory controller is adapted to interleave the data and the error correction code together responsive to a destination address for the data.

19. The system of claim 13, wherein the memory controller is further adapted to calculate a respective error correction code for each byte of the data.

20. An article of manufacture, comprising:
a program storage device having stored thereon program instructions executable by a processing device to perform operations for providing an error correction code memory system, the operations comprising:
receiving data for processing;
processing error correction codes associated with at least a portion of the data;
wherein the processing error correction codes associated with at least the portion of the data comprises generating a first set of error correction codes and replicating the first set of error correction codes at least once as a respective second set of error correction codes; and
mapping the data and the error correction codes for a small footprint memory, wherein the error correction codes and the portion of the data are multiplexed across pins of the small footprint memory;
wherein the mapping the data and the error correction codes comprises mapping the first and second sets of error correction codes across different ones of the pins.

* * * * *

UNITED STATES PATENT AND TRADEMARK OFFICE
CERTIFICATE OF CORRECTION

PATENT NO. : 7,620,875 B1  Page 1 of 1
APPLICATION NO. : 11/369337
DATED : November 17, 2009
INVENTOR(S) : Nelson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 925 days.

Signed and Sealed this

Twenty-sixth Day of October, 2010

David J. Kappos
*Director of the United States Patent and Trademark Office*